United States Patent
Gardner et al.

[19]

[11] Patent Number: 6,107,146
[45] Date of Patent: Aug. 22, 2000

[54] METHOD OF REPLACING EPITAXIAL WAFERS IN CMOS PROCESS

[75] Inventors: Mark I. Gardner, Cedar Creek; Mark C. Gilmer, Austin, both of Tex.

[73] Assignee: Advanced Micro Devices, Inc., Sunnyvale, Calif.

[21] Appl. No.: 08/995,113

[22] Filed: Dec. 19, 1997

[51] Int. Cl.$^7$ ................................................ H01L 21/336
[52] U.S. Cl. ......................... 438/300; 438/301; 438/305
[58] Field of Search ................................... 438/300, 305, 438/301

[56] References Cited

U.S. PATENT DOCUMENTS

| | | | |
|---|---|---|---|
| 4,417,325 | 11/1983 | Harari | 365/185 |
| 4,749,662 | 6/1988 | Custode | 437/58 |
| 5,087,579 | 2/1992 | Tomassetti | 437/31 |
| 5,338,696 | 8/1994 | Iiderem et al. | 437/34 |
| 5,441,900 | 8/1995 | Bulucea et al. | 437/24 |
| 5,885,879 | 3/1999 | Gardner et al. | 438/305 |
| 5,899,714 | 5/1999 | Farrenkopf et al. | 438/202 |

*Primary Examiner*—Richard Elms
*Assistant Examiner*—Michael S. Lebentritt
*Attorney, Agent, or Firm*—Joseph Lally; Dewan & Lally, LLP

[57] ABSTRACT

A method of utilizing a non-epitaxial starting material in a CMOS semiconductor fabrication process. A bulk impurity distribution is non-selectively introduced into the starting material. The starting material includes a substantially uniformly doped wafer having a sheet resistivity in the range of approximately 5 to 25 Ω-cm. An upper boundary of the bulk impurity distribution is displaced below an upper surface of the wafer by a first depth. A peak impurity concentration of the bulk impurity distribution is greater than approximately $1 \times 10^{19}$ atom/cm$^3$. Thereafter, a barrier impurity distribution is introduced into the wafer. A peak concentration of the barrier impurity distribution is displaced below the upper surface of the wafer by a second depth. The first depth is greater than the second depth such that the barrier impurity distribution may substantially prevent the bulk impurity distribution from migrating into the upper region of the wafer. Accordingly, the wafer of the present invention comprises a lightly doped upper region over a heavily doped bulk region. The bulk layer improves latchup immunity of the CMOS integrated circuit process by providing a conductive path below the upper region.

14 Claims, 2 Drawing Sheets

METHOD OF REPLACING EPITAXIAL WAFERS IN CMOS PROCESS

BACKGROUND OF THE INVENTION

1. Field of the Invention

The present invention relates to the field of semiconductor fabrication, and more particularly to a method and wafer for replacing costly starting material typically associated with advanced CMOS processes with a more economical starting material without sacrificing latchup immunity.

2. Description of the Relevant Art

Integrated circuits fabricated on semiconductor substrates are well known. In a typical MOS semiconductor process, a plurality of MOS transistors are fabricated in a silicon substrate through a series of photolithography, implant, oxidation, etch, and other well known semiconductor process steps. In a CMOS semiconductor process, n-channel and p-channel transistors are fabricated on a monolithic silicon substrate. Typically, the p-channel transistors are located within a n-type region of the silicon substrate while the n-channel transistors are located within a p-type portion of the silicon substrate.

To achieve maximum performance from the integrated circuit, it is typically desirable to fabricate the n-channel and p-channel transistors within a relatively lightly doped "well". Lightly doped wells decrease junction capacitances that reduce the response time of the transistor. Unfortunately, the requirement of producing n-channel transistors within a p-type region of the substrate and p-channel transistors within a n-type portion of the substrate results in the unintended formation of a pair of unwanted parasitic bipolar transistors. Under certain abnormal, but nevertheless frequently occurring, operating conditions, the cross-coupled parasitic transistors can be turned on. The arrangement of the pair of parasitic transistors forms an undesirable positive feedback loop that can result in a low impedance and potentially destructive path from the power supply ($V_{DD}$) to ground.

Referring to FIG. 1 a simplified partial cross sectional view of a CMOS integrated circuit is shown. A vertical pnp bipolar transistor 101 is comprised of a p+ source/drain region 102, which serves as the emitter, n-well 104, which serves as the base, and in the embodiment shown in FIG. 1, a p-type epitaxial layer 106 formed over a p+ bulk 120 which serve as the collector of pnp transistor 101. The CMOS integrated circuit shown in FIG. 1 further includes a laterally oriented npn transistor 110 comprising a n+ source/drain region 112, which acts as the emitter of transistor 110, p-well region 114, which acts as the base, and n-well region 104, which acts as the collector. It will be appreciated that the collector of bipolar transistor 101 and the base of transistor 110 are located within p-type regions of the silicon wafer between which no significant potential barrier exists. Thus, the collector current $i_{c2}$ of transistor 101 will act as a base current $i_{b1}$ of transistor 110 in the absence of an alternative path to ground. If the base current $i_{b1}$ of transistor 110 is sufficient to turn transistor 110 on, a current will flow from collector to emitter of transistor 110 thereby increasing the base current of transistor 101 which, in turn, increases the collector current $i_{c2}$ and the base current $i_{b1}$.

In this manner, it can be seen that the pair of coupled bipolar transistors 101 and 110 form a positive feedback mechanism which can result in extremely low impedance path from $V_{DD}$ resulting in a significant and unwanted power dissipation within the integrated circuit causing the silicon substrate to rise in temperature and potentially resulting in device failure. This phenomenon in CMOS integrated circuits is known as a latchup condition. Because CMOS integrated circuits are increasingly popular because of their potential for low power dissipation under normal operating circumstances, semiconductor manufacturers have devoted an enormous amount of energy to address and minimize the problems associated with the CMOS latchup. One effective method of improving an integrated circuit's immunity to latchup is to provide a low impedance path n the bulk or substrate of the silicon wafer to effectively shunt current that would otherwise participate as a base current into the laterally oriented transistor 110. Such a path is provided by a typically provided heavily doped p+ bulk region 120 as shown in FIG. 1. By reducing the substrate resistance $r_{sub}$, the substrate current $i_{sub}$ is increased. An increase in the substrate current $i_{sub}$ results in a lower base current $i_{b1}$, of bipolar transistor 110. In this manner, the heavily doped bulk provides a mechanism of preventing the positive feedback loop previously described from turning on.

Accordingly, it will be appreciated from the proceeding discussion that to achieve simultaneously the goals of improving the performance characteristics of a CMOS integrated circuit while maintaining adequate immunity to latchup, it is beneficial to provide a starting material that includes a lightly doped region formed over a heavily doped region. The lightly doped region provides a suitable substrate for the formation of complimentary and relatively lightly doped well regions desirable for the fabrication of high speed integrated circuits. The heavily doped bulk portion of the starting material provides the necessary low impedance path required for addressing and improving latchup immunity. It will be further appreciated to those skilled in the art of CMOS semiconductor fabrication that, for a large percentage of integrated circuit applications, it is desirable if the starting material is doped p-type. Thus a suitable starting material commonly found in CMOS semiconductor fabrication facilities includes a lightly doped p-type layer formed over a heavily doped p+ layer. Maximum immunity to latchup is obtained when the lightly doped upper region of the starting material is as shallow as possible. Unfortunately, the relatively high mobility of boron, which is typically used as a p-type impurity in a silicon substrate, places a lower limit on the depth of the lightly doped region of the substrate. Impurities within the heavily doped portion of the starting material may migrate toward the surface of the silicon substrate during high temperature processing undesirably resulting in an increased doping level within the lightly doped region possibly resulting in a redistribution sufficient to render the device inoperable. Furthermore, in addition to concerns about the redistribution of boron atoms within the heavily doped portion of the wafer during subsequent processing, starting material that has the desired lightly doped region formed over a heavily doped region is typically obtained only at a premium over the cost of obtaining uniformly doped starting materials. Accordingly, it would be desirable to provide a starting material alternative for a semiconductor manufacturer that addresses the concerns related to the costs of conventional epitaxial wafers, the problem of up diffusion of boron atoms, and permits the fabrication of heavily doped regions within the starting material in extremely close proximity to the upper surface of the silicon.

SUMMARY OF THE INVENTION

The problems identified above are in large part addressed by a method of utilizing a non-epitaxial starting material in a CMOS semiconductor fabrication process without degrading the latchup immunity of the process. Thus, it is an object of the present invention to provide a method by which the high cost of epitaxial wafers typically used for CMOS processes can be avoided. It is another object of the invention to present a mechanism by which the up-diffusion of mobile impurities within a heavily doped bulk region of a starting material may be substantially prevented from migrating towards the upper region of the silicon substrate. It is another object of the invention to present a method in which the lightly doped region of the starting material maybe fabricated with a depth significantly less than the epitaxial layers typically used in CMOS integrated circuit processes.

Broadly speaking, the present invention contemplates a method of utilizing nonepitaxial starting material in a CMOS semiconductor fabrication process without reducing latchup immunity. A bulk impurity distribution is non-selectively introduced into a starting material. The starting material is comprised of a uniformly doped wafer having a sheet resistivity in the range of approximately 5 to 25 $\Omega$-cm. An upper boundary of the bulk impurity distribution is displaced below an upper surface of the wafer by the first depth. A peak impurity concentration of the bulk impurity distribution is greater than approximately $1\times10^9$ atoms/cm$^3$ a barrier impurity distribution is then introduced into the wafer. A peak concentration of the barrier impurity distribution is displaced below the upper surface of the wafer by a second depth. The first depth is greater than the second depth. In this manner, the barrier impurity distribution substantially prevents the bulk impurity distribution from migrating into an upper region of the wafer. Accordingly, the wafer of the present invention includes a lightly doped upper region over a heavily doped bulk layer. The bulk layer improves latchup of immunity of the process by providing a conductive path below the upper region into which the semiconductor transistors will be fabricated.

Preferably, the introduction of the bulk impurity distribution is accomplished by implanting a species such as arsenic, phosphorous, antimony, or boron. An implant dose suitably used for this implant is preferably in excess of approximately $1\times10^{14}$ atoms/cm$^2$. A suitable implant energy is preferably in the range of approximately 200 to 2000 keV. In one embodiment, the wafer is annealed after the introduction of the bulk impurity distribution by immersing the wafer in and inert ambient maintained at a temperature in the range of approximately 400 to 900° C ;for a duration in the range of approximately 2 to 20 minutes. In one embodiment, the barrier impurity distribution is achieved by implanting a nitrogen bearing species into the silicon substrate. In this embodiment, the nitrogen species implant is accomplished with an implant dose in the range of approximately $1\times10^{12}$ to $5\times10^{14}$ atoms/cm$^2$ using an implant energy in the range of approximately 5 to 50 keV. Ideally, the first depth is in the range of approximately 0.3 to 1.5 microns.

The present invention further contemplates a semiconductor wafer suitable for fabricating CMOS integrated circuits. The wafer includes a heavily doped bulk region vertically displaced between a lightly doped upper region and a lightly doped sub-bulk portion of the wafer. The upper region, the bulk region, and the sub-bulk region share a common conductivity type. The bulk region is suitable for improving a latchup immunity of the wafer. In one embodiment, the semiconductor wafer further includes a nitrogen bearing impurity distribution within the wafer. In this embodiment, a peak concentration of the nitrogen bearing impurity distribution is vertically displaced within the wafer above the bulk region. The nitrogen bearing impurity distribution is suitable for substantially preventing impurities from within the bulk region of the silicon substrate from migrating to the upper surface of the substrate. A peek impurity concentration within the bulk region of the semiconductor wafer is preferably in excess of approximately $1\times10^{19}$ atom/cm$^3$. A room temperature resistivity of the upper region is preferably in the range of approximately 5 to 25 $\Omega$-cm. In a presently preferred embodiment, the predominant impurity species within the bulk region of the semiconductor wafer is boron. A depth of the bulk region is suitably in the range of approximately 0.3 to 1.5 microns below the upper surface of the semiconductor wafer.

The present invention further includes a semiconductor process in which a bulk impurity distribution is introduced into a lightly and substantially uniformly doped semiconductor wafer. An upper surface of the bulk impurity distribution is vertically displaced below the upper surface of the wafer by a first depth. A peak impurity concentration of the bulk impurity distribution is preferably greater than approximately $1\times10^{19}$ atom/cm$^3$. A barrier impurity distribution is then introduced into the wafer. A peak concentration of the barrier impurity distribution is vertically displaced below the wafer upper surface by a second depth. The second depth is less than the first depth such that the barrier impurity distribution substantially prevents the bulk impurity distribution from migrating into the wafer upper region. A CMOS integrated circuit is then formed within the wafer upper region. The integrated circuit includes a p-channel MOS transistor formed within an n-type portion of the upper region and an n-channel MOS transistor is formed within a p-type portion of the upper region. The bulk impurity distribution of the wafer improves a latchup immunity of the CMOS integrated circuit by providing a low resistivity path below the upper region of the wafer.

BRIEF DESCRIPTION OF THE DRAWINGS

Other objects and advantages of the invention will become apparent upon reading the following detailed description and upon reference to the accompanying drawings in which.

Figure 1:
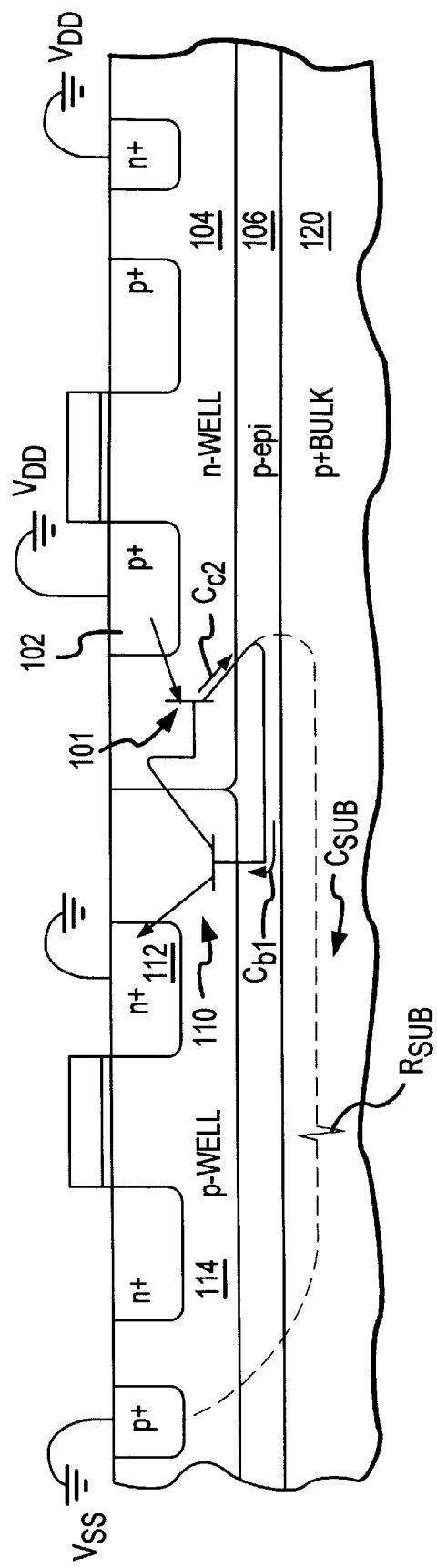
FIG. 1 is a partial cross-sectional view of a CMOS integrated circuit fabricated on a starting material that includes an epitaxial layer formed over a heavily doped bulk.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Figure 2:
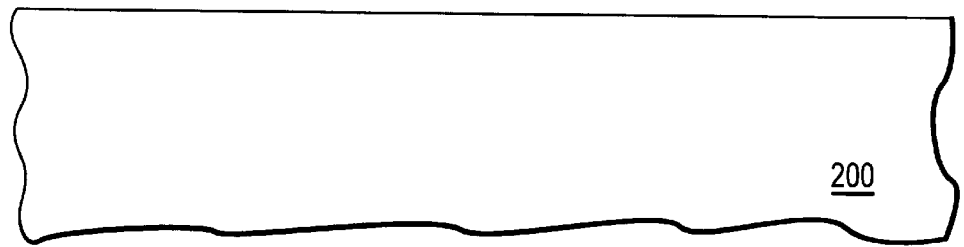
FIG. 2 is a partial cross-sectional view of a uniformly and lightly doped semiconductor wafer.

Turning now to FIGS. 2–5, a process flow according to one embodiment of the present invention is depicted. Referring to FIG. 2, a suitable starting material for use in the present invention is shown. Starting material 200, in a presently preferred embodiment, comprises a single crystal silicon wafer as is well-known in the field of semiconductor fabrication. The present invention contemplates substituting an economical starting material for the relatively expensive "epi" wafers typically used in conventional CMOS submicron processes. Accordingly, starting material 200, in the preferred embodiment, has a substantially uniform doping concentration. In addition, the doping concentration of starting material 200 is preferably relatively lightly doped such that a resistivity of starting material 200 at room temperature is in the range of approximately 5 to 25 Ω-cm. In an embodiment useful in the fabrication of a wide array of CMOS integrated circuit devices, starting material 200 is a p-type material typically doped with boron. It will be appreciated, however, that an n-type starting material may be suitable for particular types of CMOS integrated circuits including, for example, static RAM's and other devices susceptible to induced errors caused by alpha particle radiation. By eliminating the epitaxial layer typically associated with starting materials for conventional CMOS integrated circuit processes, the present invention is able to utilize a relatively economical starting material. In addition, the elimination of the epitaxial growth formation associated with conventional CMOS starting materials may result in a starting material that includes fewer inherent defects, possibly resulting in an increased fabrication yield. Starting materials such as the starting material described herein are commercially available from a number of semiconductor suppliers including Monsanto, Wacker, and Siltec.

Turning now to FIG. 2, a bulk impurity distribution 210 is introduced into starting material 200. The preferred method of introducing bulk impurity distribution 210 into starting material 200 includes an ion implantation process represented in FIG. 2 by reference numeral 212. Ideally, bulk impurity distribution 210 is introduced into starting material 200 at the beginning of the fabrication process. In the preferred embodiment, the introduction of the bulk impurity distribution is carried out non-selectively. In other words, the bulk impurity distribution extends throughout the entire starting material 200. This non-selective introduction is accomplished, in one embodiment, by implanting the appropriate impurity species into starting material 200 with no implant mask present on an upper surface 201 of starting material 200.

In the preferred embodiment, the bulk impurity distribution 210 includes an upper boundary 211 that is vertically displaced below upper surface 201 of starting material 200 by a first depth $d_1$ and further includes a lower boundary 213. Thus, the introduction of bulk impurity distribution 210 into starting material 200 results in the creation of a semiconductor wafer 218 suitable for fabricating CMOS integrated circuits. Wafer 218 includes a heavily doped bulk region 215 vertically displaced between a lightly doped upper region 214 and a lightly doped sub-bulk region 216. In an embodiment of the present invention in which bulk impurity distribution 210 is fabricated with an ion implantation process 212, a suitable implant dose is in excess of approximately $1 \times 10^{14}$ atoms/cm² using an implant energy in the range of approximately 200 to 2000 keV. In an embodiment in which starting material 200 is initially p-type, a suitable implant species includes boron. In an n-type embodiment, a suitable implant dose may include arsenic, phosphorus, or antimony. In either case, it will be appreciated that the conductivity type of lightly doped upper region 214, bulk region 215, and sub-bulk region 216 have a common conductivity type.

Figure 3:
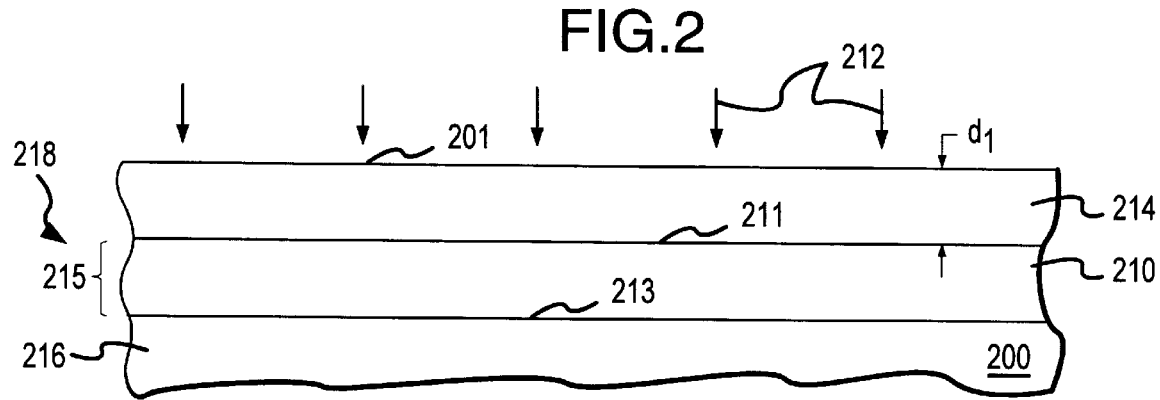
FIG. 3 is a processing step subsequent to FIG. 2 in which a heavily doped bulk impurity distribution is introduced into the substrate.

The semiconductor wafer 218 as shown in FIG. 3 is suitable for fabricating deep submicron CMOS integrated circuits by virtue of the relatively lightly doped region 214 placed over a heavily doped bulk region 215. The lightly doped upper region 214 is a suitable environment into which CMOS transistors may be fabricated while heavily doped bulk region 215 improves the latchup immunity of the integrated circuit by providing a relatively highly conductive path in parallel with the inevitable parasitic bipolar transistors that will result from the formation of the CMOS integrated circuit within upper region 214. Preferably, a peak impurity concentration within bulk region 215 is in excess of approximately $1 \times 10^{19}$ atom/cm³. It will be further appreciated that a structure such as shown in wafer 218 in which a heavily doped region is vertically displaced between a pair of lightly doped regions may be required in a double sided fabrication process. A double sided fabrication process refers to a process in which the upper surface 201 and a lower surface (not specifically shown in the drawings) are utilized for fabricating integrated circuits. Conventional epitaxial wafers are unsuitable for double sided processing because the heavily doped bulk region of the typical epitaxial wafer extend from a lower surface of the wafer to the epitaxial layer.

The present invention further contemplates a starting material suitable for fabricating CMOS integrated circuits in which latchup immunity is further improved by providing an extremely shallow lightly doped region 214. It is known that the latchup immunity provided by using epitaxial starting material in conventional CMOS processes improves as the depth of the epitaxial layer is decreased. The present invention contemplates that the upper boundary 211 of bulk impurity distribution 210 is vertically displaced below upper surface 201 by a first depth $d_1$ in the range of approximately 0.3 to 1.5 microns. By facilitating a shallow lightly doped region 214, it is theorized that the present invention may actually improve upon the latchup immunity provided by a conventional epi wafer starting material in which the minimum thickness of the epitaxial layer is limited by the inevitable migration of impurities within the heavily doped bulk region toward the upper surface and into the epitaxial layer of the substrate.

Figure 4:
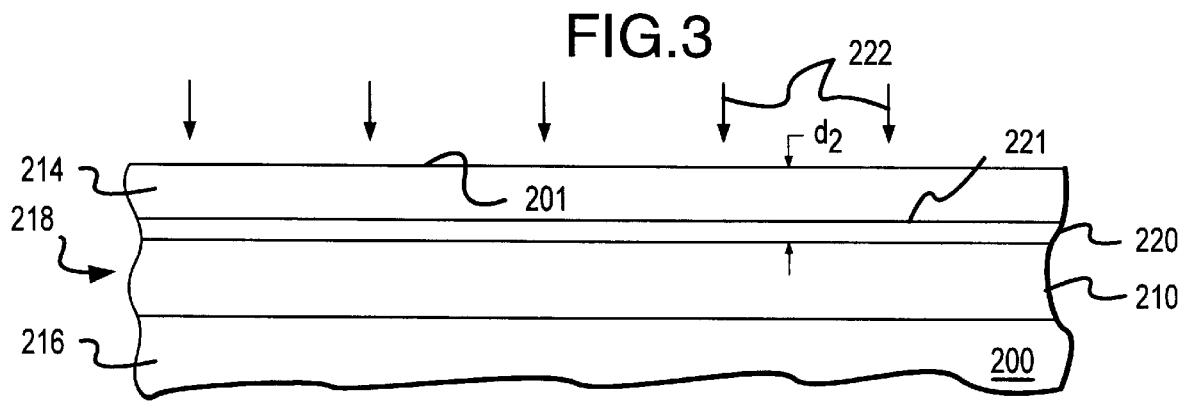
FIG. 4 is a processing step subsequent to FIG. 3 in which a barrier impurity distribution is introduced into the substrate.

Turning now to FIG. 4, the present invention contemplates substantially preventing the upward migration of mobile impurities within the heavily doped bulk region 215 of the wafer 218 by introducing a barrier impurity distribution 220 into wafer 218. Barrier layer 220, in a presently preferred embodiment, comprises a nitrogen bearing impurity species preferably introduced into wafer 218 through the use of an ion implantation process represented in FIG. 4 by reference numeral 222. In a presently preferred embodiment, ion implantation 222 is accomplished with an implant dose in the range of approximately $1 \times 10^{12}$ to $5 \times 10^{15}$ atom/cm² using an implant energy in the range of approximately 5 to 50 keV. A peak impurity concentration of barrier impurity distribution 220 is located, in a presently preferred embodiment, at a second depth $d_2$ below upper surface 201 of wafer 218. The second depth $d_2$ is less than the first depth $d_1$ at which the upper boundary 211 of bulk impurity distribution 210 is located such that a barrier impurity distribution is positioned to prevent migration of mobile impurities within bulk impurity distribution 210 from migrating into lightly doped region 214 of wafer 218.

It is the presence of the barrier impurity distribution 220 that permits the first depth $d_1$ to extend well into the submicron region. In the absence of an appropriate barrier impurity distribution, the first depth $d_1$ would have to be significantly increased to prevent substantial doping of lightly doped region 214 due to migration of mobile impurities from within bulk impurity distribution 210. Although FIG. 4 shows an upper boundary 221 of nitrogen bearing impurity distribution 220 as being vertically displaced below upper surface 210 of wafer 218, it should be noted that it may be desirable in other embodiments to reduce the depth below upper surface 201 at which upper boundary 221 of barrier impurity distribution 220 is located. In other words, it may be beneficial in one embodiment to extend the barrier distribution substantially into the lightly doped region 214 towards upper surface 101 of wafer 218 to achieve any benefits provided by reducing a barrier impurity distribution such as a nitrogen distribution into active regions of the integrated circuit.

In one embodiment of the present invention it may be desirable to anneal wafer 218 either after ion implantation process 212 shown in FIG. 3 or after ion implantation 222 as shown in FIG. 4. A suitable anneal cycle would include immersing wafer 218 into an inert ambient maintained at a temperature in the range of approximately 400 to 900° C. for a duration in the range of approximately 2 to 20 minutes to anneal out any damage caused by the ion implantation processes and to activate the impurities introduced into the wafer 218 during the implantation processes. A suitable anneal cycle may be accomplished in a diffusion style tube in which a batch or plurality of wafers are simultaneously annealed or, in the alternative, the anneal may be accomplished with a rapid thermal anneal apparatus in which a single wafer is rapidly heated for a relatively short duration to a temperature in the range of approximately 800 to 1000° C.

Figure 5:
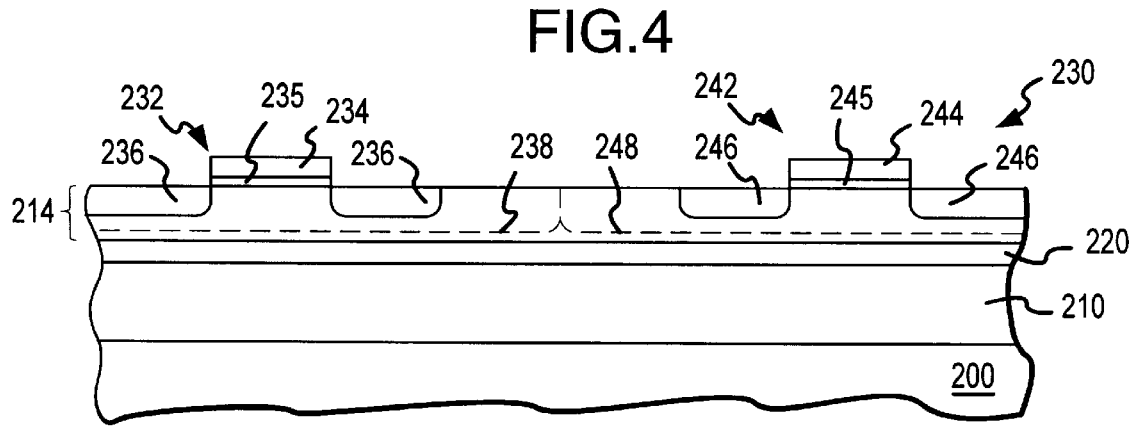
FIG. 5 is a processing step subsequent to FIG. 4 in which an n-type and a p-type transistor have been fabricated to produce a CMOS integrated circuit.

Turning now to FIG. 5, an integrated circuit 230 is fabricated in upper region 214 of wafer 218 through well-known CMOS integrated circuit processing steps in which an n-type transistor 232 is fabricated within a p-type region 238 and a p-type transistor 242 is fabricated within an n-type portion 248 of upper region 214. As will be appreciated to those skilled in semiconductor fabrication, n-type transistor 232 includes a gate structure 234, a gate dielectric 235, and a pair of source/drain impurity distributions 236. Similarly, p-type transistor 242 includes a gate structure 244, a gate dielectric 245, and a pair of source/drain impurity distributions 246. As described previously with respect to FIG. 1, the presence of adjacent p-channel and n-channel transistors within oppositely doped portions of a silicon substrate results in a pair of coupled parasitic bipolar transistors (not specifically drawn in FIG. 5). The heavily doped bulk impurity distribution 210 provides a conductive path through which current that might otherwise contribute to the effective base current of the parasitic bipolar transistors is shunted and thereby improves the latchup immunity of the integrated circuit. In addition, the presence of the barrier impurity distribution 220 in the preferred embodiment enables an extremely shallow, lightly doped region 214 which further contributes to improved latchup immunity. In the preferred embodiment, the depth of lightly doped region 214 is preferably in the range of approximately 0.3 to 1.5 microns. Although the specific embodiment depicted in FIG. 5 identifies a twin well process in which a p-well represented by reference numeral 238 and an n-well region 248 are formed within the lightly doped region 214 of the wafer 218, it will be appreciated that the present invention is equally applicable to a single well process in which the lightly doped region itself serves as the well into which transistors of the opposite conductivity type are fabricated. It is further noted that although p-type starting material is presently preferred in a variety of CMOS integrated circuits and presents a more significant concern with respect to migration of mobile impurities, the present invention is equally applicable to n-type starting material.

Accordingly, it will be appreciated to those skilled in the art that the present invention contemplates producing a CMOS integrated circuit using a starting material comprised of a substantially uniformly doped silicon lattice thereby permitting a cost savings associated with the elimination of epitaxial starting material. It will be further appreciated that the present invention is suitable for fabricating integrated circuit transistors into an extremely shallow lightly doped region of the substrate. It will be still further appreciated that, by providing a barrier impurity distribution, the present invention addresses the problems associated with migration from a heavily doped region into a lightly doped region of the CMOS wafer. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. In a CMOS semiconductor fabrication process, a method of utilizing a non-epitaxial starting material without degrading latchup immunity, said method comprising:

non-selectively introducing a bulk impurity distribution into said starting material, said starting material comprised of a substantially uniformly doped wafer with a sheet resistivity in the range of approximately 5 to 25 Ω-cm, wherein an upper boundary of said bulk impurity distribution is displaced below an upper surface of said wafer by a first depth and wherein a peak impurity concentration of said bulk impurity distribution is greater than approximately $1 \times 10^{19}$ atoms/cm$^3$; and introducing a nitrogen bearing barrier impurity distribution into said wafer, wherein a peak concentration of said barrier impurity distribution is displaced below said upper surface of said wafer by a second depth, and wherein said first depth is greater than said second depth and wherein said barrier impurity distribution substantially prevents said bulk impurity distribution from migrating into an upper region of said wafer, whereby said wafer comprises a lightly doped upper region over a heavily doped bulk layer, wherein said bulk layer improves a latchup immunity of said CMOS process by providing a conductive path below said upper region.

2. The process of claim 1, wherein the step of introducing said bulk impurity distribution comprises implanting a species selected from the group comprised of arsenic, phosphorous, antimony, and boron.

3. The process of claim 2, wherein an implant dose of said implanting is in excess of approximately $1 \times 10^{14}$ atoms/cm$^2$ and further wherein an implant energy is in the range of approximately 200 to 2000 keV.

4. The process of claim 2, further comprising, after said introducing of said bulk impurity distribution, immersing said wafer in an inert ambient maintained at a temperature in the range of approximately 400 to 900° C. for a duration in the range of approximately 2 to 20 minutes.

5. The process of claim 1, wherein the step of introducing said nitrogen barrier impurity distribution comprises implanting a nitrogen bearing species.

6. The process of claim 5, wherein said implanting of said nitrogen species is accomplished with an implant dose in the range of approximately $1\times10^{12}$ to $5\times10^{15}$ atoms/cm$^2$ and an implant energy in the range of approximately 5 to 50 keV.

7. The process of claim 1, wherein said first depth is in the range of 0.3 to 1.5 microns.

8. A semiconductor fabrication process comprising:

introducing a bulk impurity distribution into a lightly and substantially uniformly doped semiconductor wafer, wherein an upper surface of said bulk impurity distribution is vertically displaced below an upper surface of said wafer by a first depth, and wherein a peak impurity concentration of said bulk impurity distribution is greater than approximately $1\times10^{19}$ atoms/cm$^3$;

introducing a nitrogen bearing barrier impurity distribution into said wafer, wherein a peak concentration of said barrier impurity distribution is vertically displaced below said wafer upper surface by a second depth, wherein said second depth is less than said first depth whereby said barrier impurity distribution substantially prevents said bulk impurity distribution from migrating into said wafer upper region; and forming a CMOS integrated circuit within said wafer upper region, wherein said CMOS integrated circuit includes a p-channel MOS transistor formed within an n-type portion of said upper region and an n-channel MOS transistor formed within a p-type portion of said upper region, wherein said bulk impurity distribution improves latchup immunity of said CMOS integrated circuit by providing a low resistivity path below said upper region of said wafer.

9. The process of claim 8, wherein the step of introducing said bulk impurity distribution comprises implanting a species selected from the group comprised of arsenic, phosphorous, antimony, and boron.

10. The process of claim 9, wherein an implant dose of said implanting is in excess of approximately $1\times10^{14}$ atoms/cm$^2$ and further wherein an implant energy is in the range of approximately 200 to 2000 keV.

11. The process of claim 9, further comprising, after said introducing of said barrier impurity distribution, immersing said wafer in an inert ambient maintained at a temperature in the range of approximately 400 to 900° C. for a duration in the range of approximately 2 to 20 minutes.

12. The process of claim 8, wherein the step of introducing said nitrogen bearing barrier impurity distribution comprises implanting a nitrogen bearing species.

13. The process of claim 12, wherein said implanting of said nitrogen species is accomplished with an implant dose in the range of approximately $1\times10^{12}$ to $5\times10^{15}$ atoms/cm$^2$ and an implant energy in the range of approximately 5 to 50 keV.

14. The process of claim 8, wherein said first depth is in the range of 0.3 to 1.5 microns.

* * * * *